United States Patent [19]

Wakabayashi et al.

[11] Patent Number: 5,334,845
[45] Date of Patent: Aug. 2, 1994

[54] CHARGED BEAM EXPOSURE METHOD AND APPARATUS AS WELL AS APERTURE STOP AND PRODUCTION METHOD THEREOF

[75] Inventors: Hiroaki Wakabayashi, Kodaira; Yoshinori Nakayama, Sayama; Fumio Murai, Tokyo; Shinji Okazaki, Urawa, all of Japan

[73] Assignee: Hitachi Limited, Tokyo, Japan

[21] Appl. No.: 613,746

[22] PCT Filed: Mar. 23, 1990

[86] PCT No.: PCT/JP90/00388

§ 371 Date: Nov. 26, 1990

§ 102(e) Date: Nov. 26, 1990

[87] PCT Pub. No.: WO90/11619

PCT Pub. Date: Oct. 4, 1990

[30] Foreign Application Priority Data

Mar. 24, 1989 [JP] Japan .................. 1-070685

[51] Int. Cl.[5] .......................................... H01L 21/027
[52] U.S. Cl. .................................................. 250/492.2
[58] Field of Search ......................... 250/492.33, 492.2

[56] References Cited

FOREIGN PATENT DOCUMENTS 53-144676 12/1978 Japan .
54-71992 6/1979 Japan .
55-107780 8/1980 Japan .
59-169131 3/1983 Japan .
58-24009 5/1983 Japan .
62-73713 4/1987 Japan .
63-110635 5/1988 Japan .

OTHER PUBLICATIONS

PCT International Search Report dated Jun. 25, 1990; by Japanese Patent Office (ISA/JP).

*Primary Examiner*—Jack I. Berman
*Attorney, Agent, or Firm*—Pennie & Edmonds

[57] ABSTRACT

In an electron beam exposure method for production very high-integration semiconductor devices and its related apparatus in a conventional method, the exposure is divided into fine divisions and carried out by performing a number of shots. However, by utilizing an aperture stop produced by working a single crystalline silicon thin film finely, exposure of a predetermined range is done by one shot. According to the invention, the exposure can be accomplished by the number of shots which is smaller by about two orders than that of the conventional technique and the throughput can be improved remarkably. Since the shot number does not substantially differ depending on whether patterns are complicated or not, individual steps can be processed within substantially identical time.

12 Claims, 15 Drawing Sheets

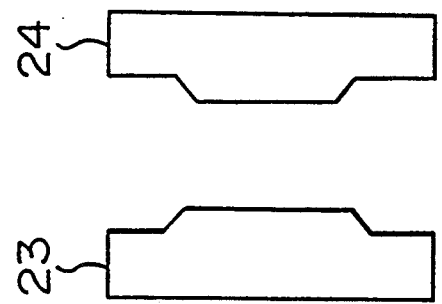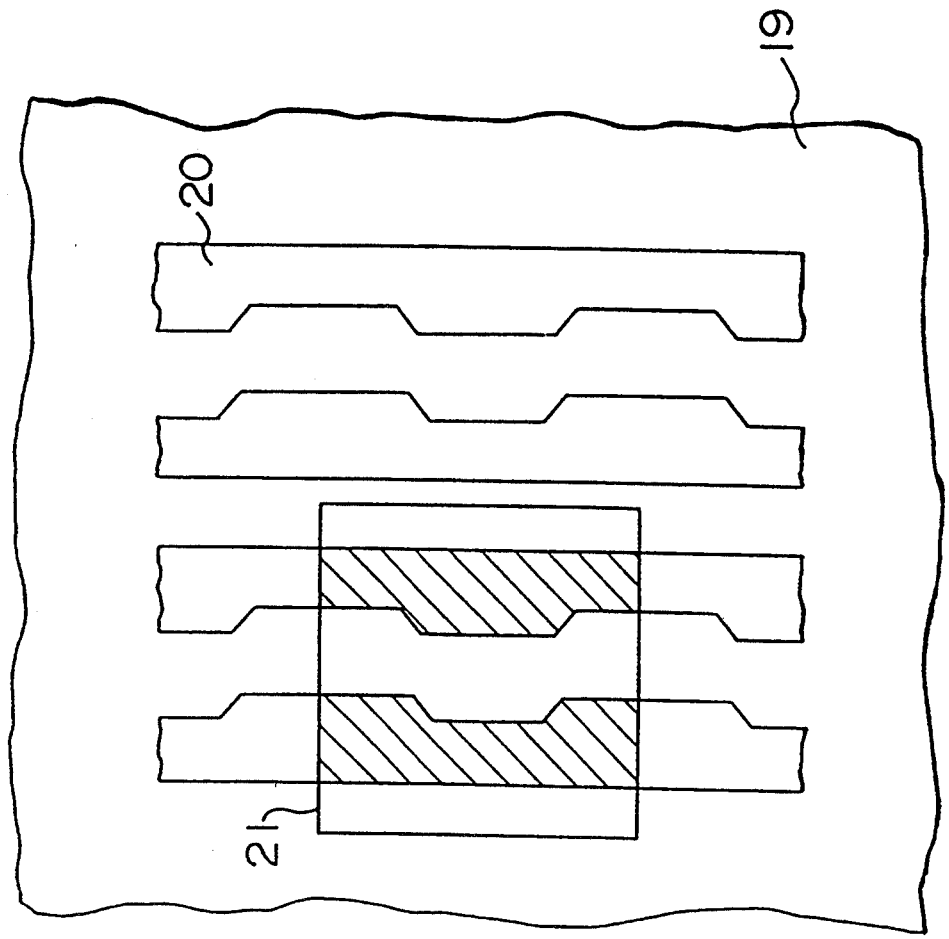

FIG. 16a  THROUGHPUT COMPARISON (1)
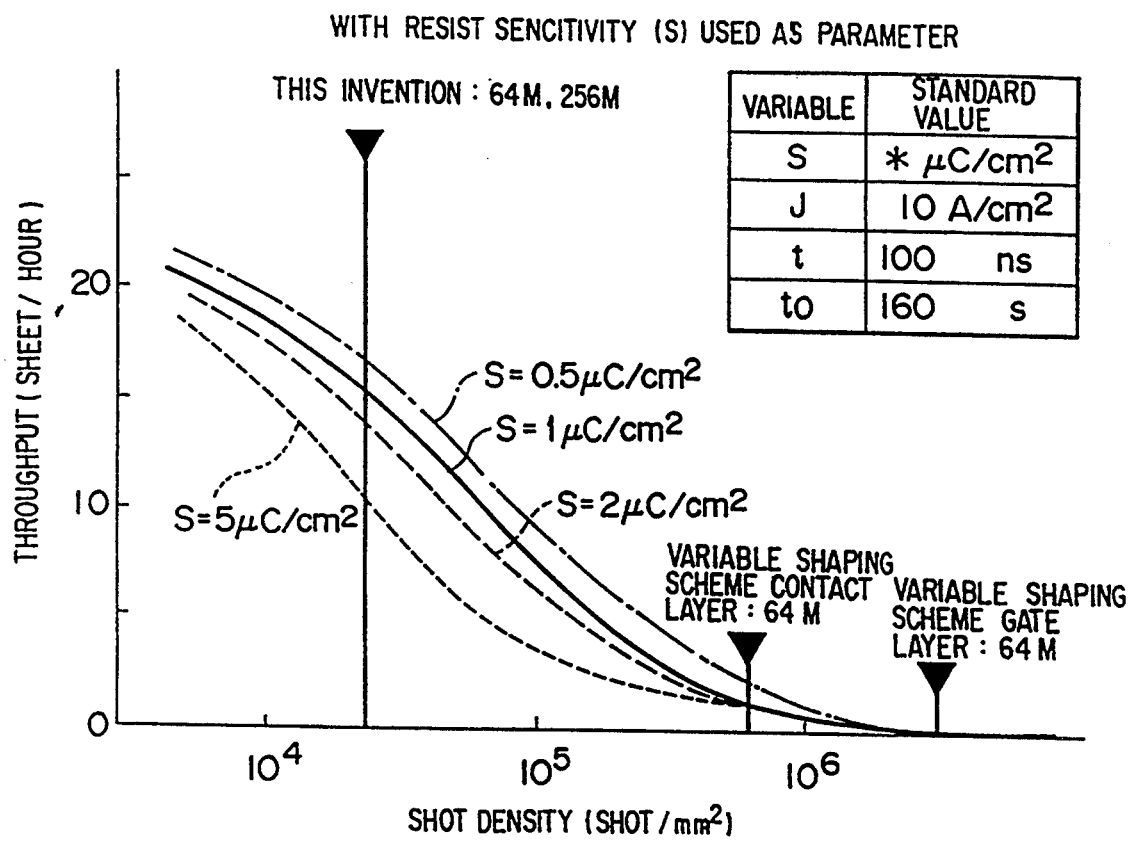
FIG. 16b  WITH CURRENT DENSITY (J) USED AS PARAMETER
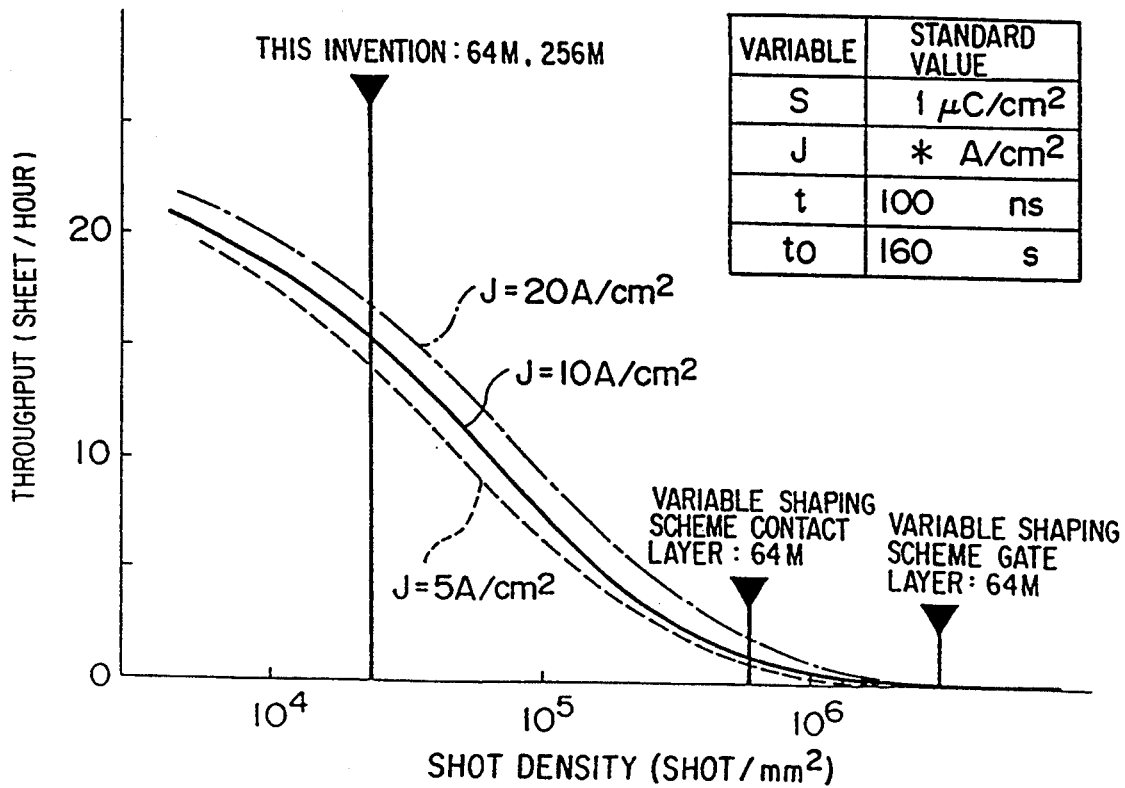

FIG. 17a THROUGHPUT COMPARISON (2)
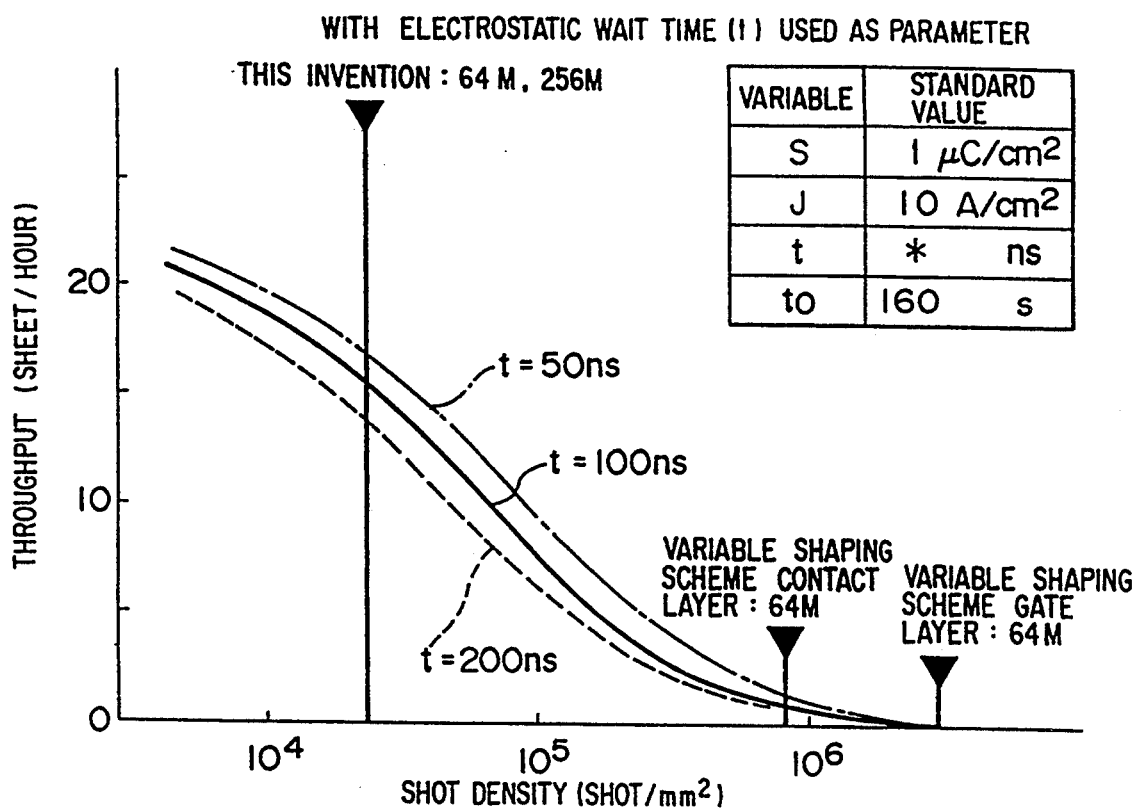
FIG. 17b WITH OVERHEAD TIME (to) USED AS PARAMETER
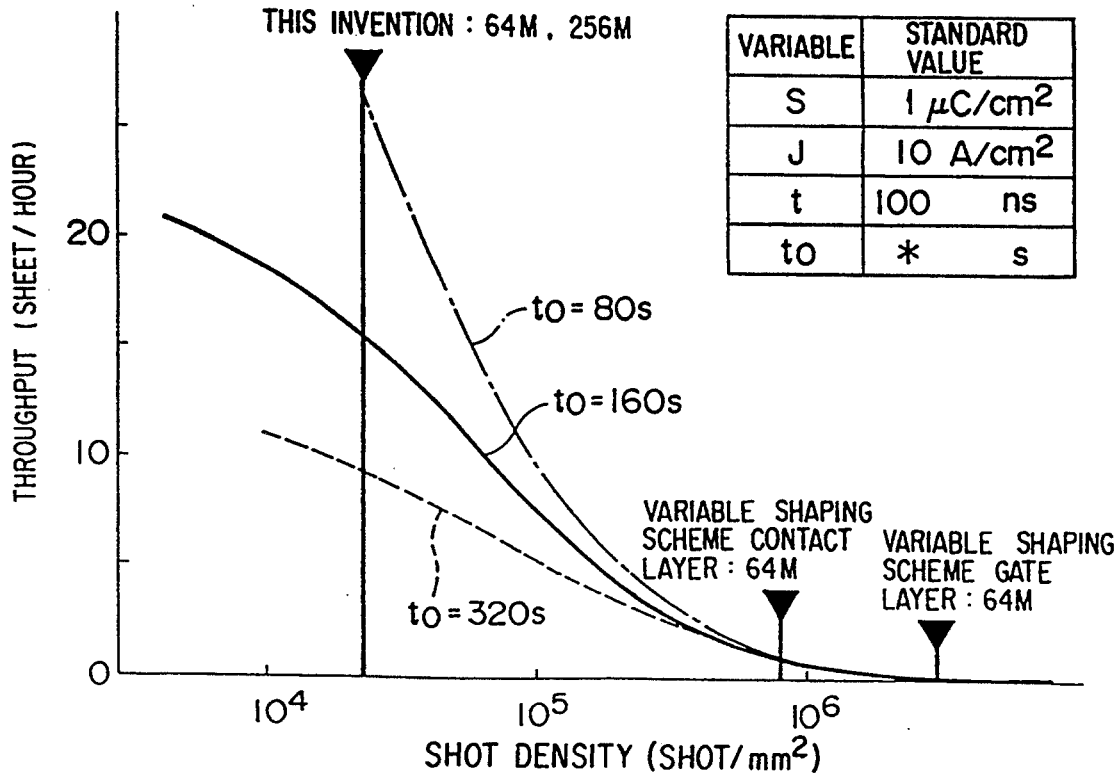

//CHARGED BEAM EXPOSURE METHOD AND APPARATUS AS WELL AS APERTURE STOP AND PRODUCTION METHOD THEREOF

TECHNICAL FIELD

This invention relates to high-throughput charged beam exposure method and charged beam exposure apparatus using a collective exposure beam in charged beam exposure methods.

BACKGROUND ART

A conventional technique will be described with reference to FIG. 4 by taking a case of exposing a pattern 20 shown in FIG. 2 as an example.

In a variable shaping method standing for the conventional technique, the shape of a charged beam is of only rectangle and therefore, as shown in FIG. 4, exposure has to be carried out by making a division in compliance with a pattern form. Accordingly, for a pattern having a number of inclined lines and a pattern having complexity, the number of shots is correspondingly increased and as a result the throughput is decreased. Especially, the number of exposure shots increases drastically for exposure of a highly integrated electronic memory device or the like having a large number of patterns and hence it takes a long time for exposure.

The aforementioned conventional technique fails to fully take into consideration a high speed processing of exposure of the highly integrated electronic memory device and the like having periodical repetition and a large number of patterns. To solve this problem, an exposure method shown in JP-A-59-169131 is available. According to this idea, the charged beam shapes are prepared including, in addition to the rectangle, shapes forming one element portion of pattern such as a pattern 23 and a pattern 24 which are shown in FIG. 3. However, the conventional aperture material is a metallic material having bad workability and practically speaking, the aperture can not be formed with a complicated shape, for example, comparable to a 64-mega bit dynamic random access memory (hereinafter abbreviated as Mb DRAM). Further, in the above example, only portions of a pattern such as a single inclined line or single polygonal line are exposed collectively but the form inclusive of even an array of pattern is not taken into account. Therefore, making a pattern division is still required and a drastic decrease in shot number can not be achieved. In addition, when shot density per unit area is increased concomitantly with high integration, the total shot number is correspondingly increased.

SUMMARY OF THE INVENTION

The above object can be accomplished by collectively handling all patterns within a constant area without making any pattern division and exposing them by one shot. To this end, even pattern forms and an array thereof contained in a constant area are taken into account and they are all built in an aperture.

As a material of the aperture built in with such a complicated pattern as above, a semiconductor single crystal, especially, silicon single crystal may be used.

An object of the invention is to provide an exposure method and an exposure apparatus which can handle even an element having such a large number of patterns as above at a high throughput and can maintain the high throughput regardless of shot density per unit area.

Another object of the invention to provide an exposure method and an exposure apparatus which can ensure high process speeds regardless of whether the pattern is complicated or not.

Another object of the invention is to provide an aperture step which can be used for the exposure method and exposure apparatus and a method for production of the aperture step.

Other objects of the invention will become apparent by reading the specification in conjunction with the drawings.

BRIEF DESCRIPTION OF THE DRAWINGS

FIGS. 2 and 5 are diagrams showing a gate layer pattern of 64 Mb DRAM pattern, FIG. 3 is a diagram for explaining aperture pattern of the conventional scheme.

BEST MODE FOR CARRYING OUT THE INVENTION

The present invention will now be described.

Figure 1A:
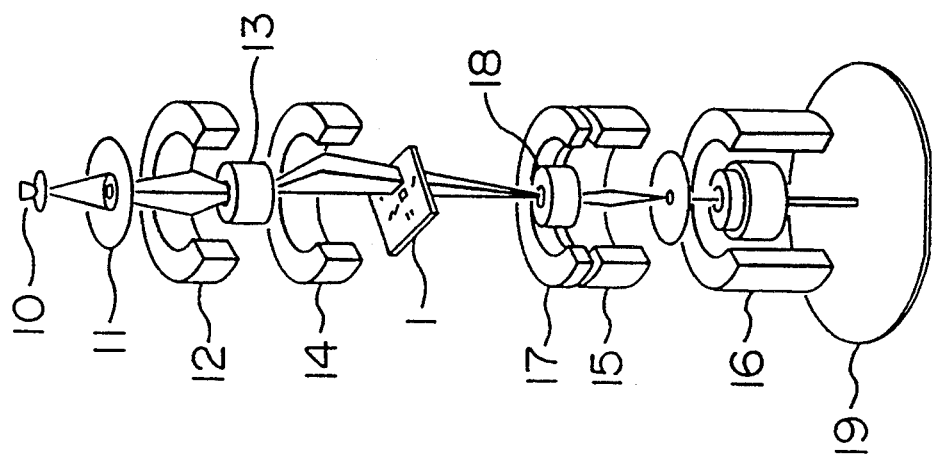
FIG. 1(a) is a schematic diagram of an exposure apparatus of the invention.
Figure 8:
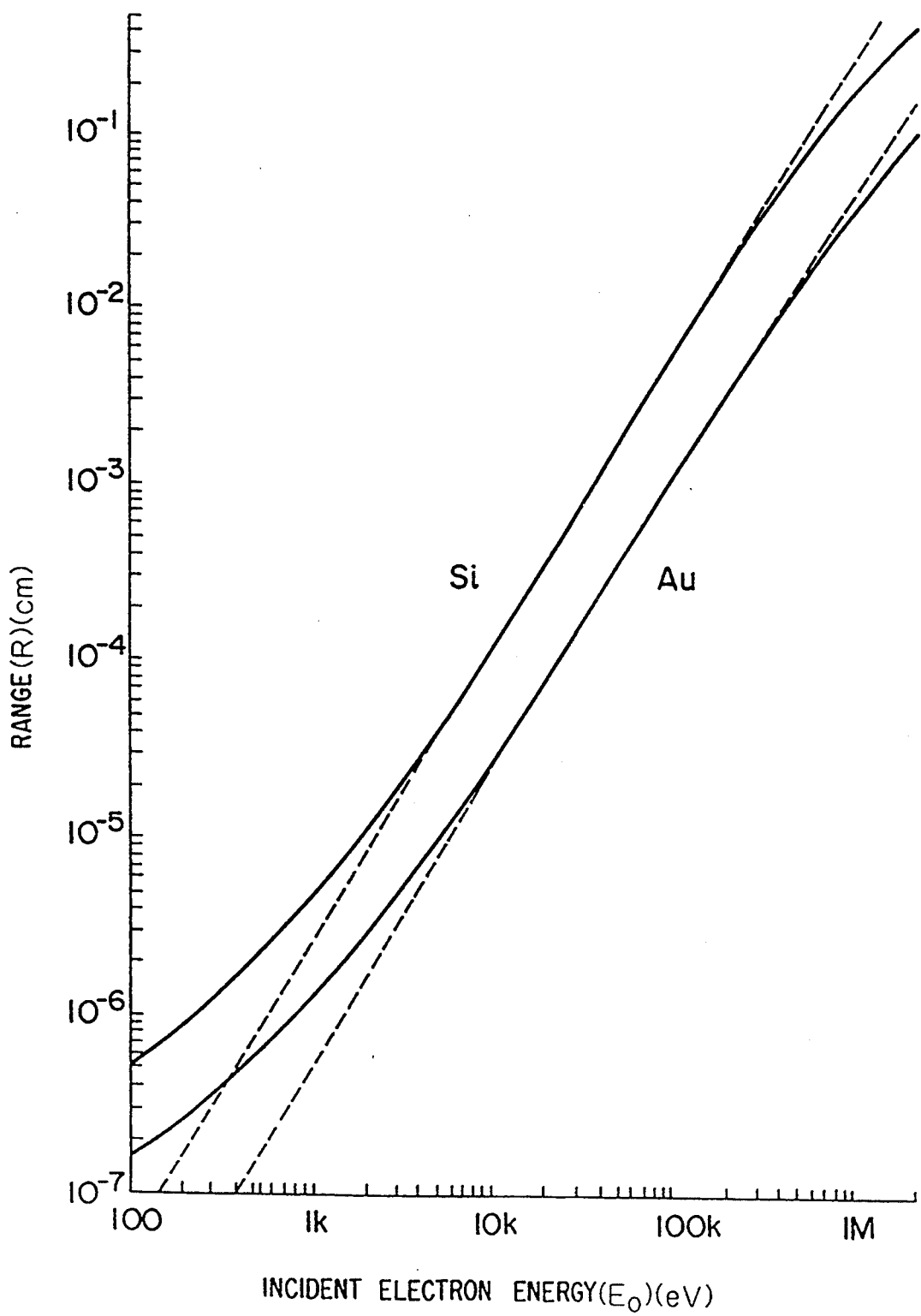
FIG. 8 is a diagram showing the relation between accelerating voltage (Eo) and range (R) of an incident electron beam.

Firstly, the principle of the invention will be described with reference to FIGS. 1, 2 and 8. For an intended repetition pattern 20, a region 21 containing all of at least one or more repetition elements is set, and all patterns within this region are magnified by several times and built in aperture means, specifically, a single crystalline silicon aperture 1. Several kinds of other patterns are also built in the aperture 1 through the same processing as above. The thickness of the single crystalline silicon film depends on energy of a charged beam used for exposure and even an electron beam standing for the lightest charged beam can be dealt with by setting a silicon film thickness identical to a range (R) which changes with accelerating voltage as shown in FIG. 8. Preferably, the thickness is from 15 $\mu$m to 20 $\mu$m. The silicon film can be pattern-worked finely to submicron level by dry etching. Where a 64 Mb DRAM has a minimum work dimension of 0.3 $\mu$m, the region 21, if set to be 2 $\mu$m×2 $\mu$m or more, can contain 2 bits or more of repetition elements. In FIG. 1(a), a charged beam emitted from charged beam generating means, that is, a beam source 10 passes through a first rectangular aperture 11 and is image-formed as a rectangular beam on the aforementioned aperture 1 by means of two formation lenses 12 and 14 standing for control means. As regards to pattern selection, a deflector 13 standing for control means causes only a desired pattern portion to undergo irradiation. The beam shaped into a pattern form is reduced and focused on a wafer 19 standing for an object to be worked by means of a swing-back deflector 18 standing for control means, a reduction lens 15 and an objective lens 16. Photoresist is provided on the wafer 19. This is reiteratively repeated by shifting the wafer by a pattern pitch so as to obtain a desired pattern 20.

In the above exposure method, the shot number equals a quotient of division of the entire pattern area by the region area built in the aperture 1 and does not at all depend on complexity of the pattern form. For this reason, the shot number can be decreased greatly as compared to the prior art.

The time necessary for exposure is determined by the product of the sum of exposure time for one shot and electrostatic wait time of electron optics and the total shot number necessary for exposure of the entirety of pattern. In the present invention, the total shot number among the above factors can be decreased, at the least, to about half and at the most to 1/1000 or less as compared to that in the conventional method. Of course, as the region area built in the aperture increases, the shot number reduction effect can further be increased. More specific embodiments will now be described.

Embodiment 1

An embodiment in exposure of a 64 Mb DRAM of a minimum work dimension of 0.3 $\mu$m will be described with reference to FIG. 1, 2, 8, 9, 10, 11, 12, 13, 14 and 15.

In the drawings referred to by the following description, character 1 designates a second aperture, 2 and 6 aperture patterns for gate layer, 3, 5 and 7 aperture patterns, 4 a rectangular pattern, 8 an aperture pattern for contact layer, 9 an aperture for gate pattern of 256 Mb DRAM, 10 a charged particle beam source, 11 a first shaping aperture, 12 a first formation lens, 13 a shaping deflector, 14 a second formation lens, 15 a reduction lens, 16 an objective lens, 17 a swing-back lens, 18 an auxiliary lens, 19 a wafer, 20 a gate layer pattern of 64 Mb DRAM, 21 a 2 $\mu$m×2 $\mu$m region, 22 a 4 $\mu$m×4 $\mu$m region, 23 and 24 aperture patterns, 25 a contact layer pattern of 64 Mb DRAM, 26 a (100) silicon substrate, 26' a silicon thin film, 27 a silicon dioxide film, 28 a gold thin film, 29 a high-concentration layer, 30 an opened pattern, 31 a back opened pattern, 32 and 32' silicon nitride films, 33 a resist and 34 a silicon thin film portion.

Figure 1B:
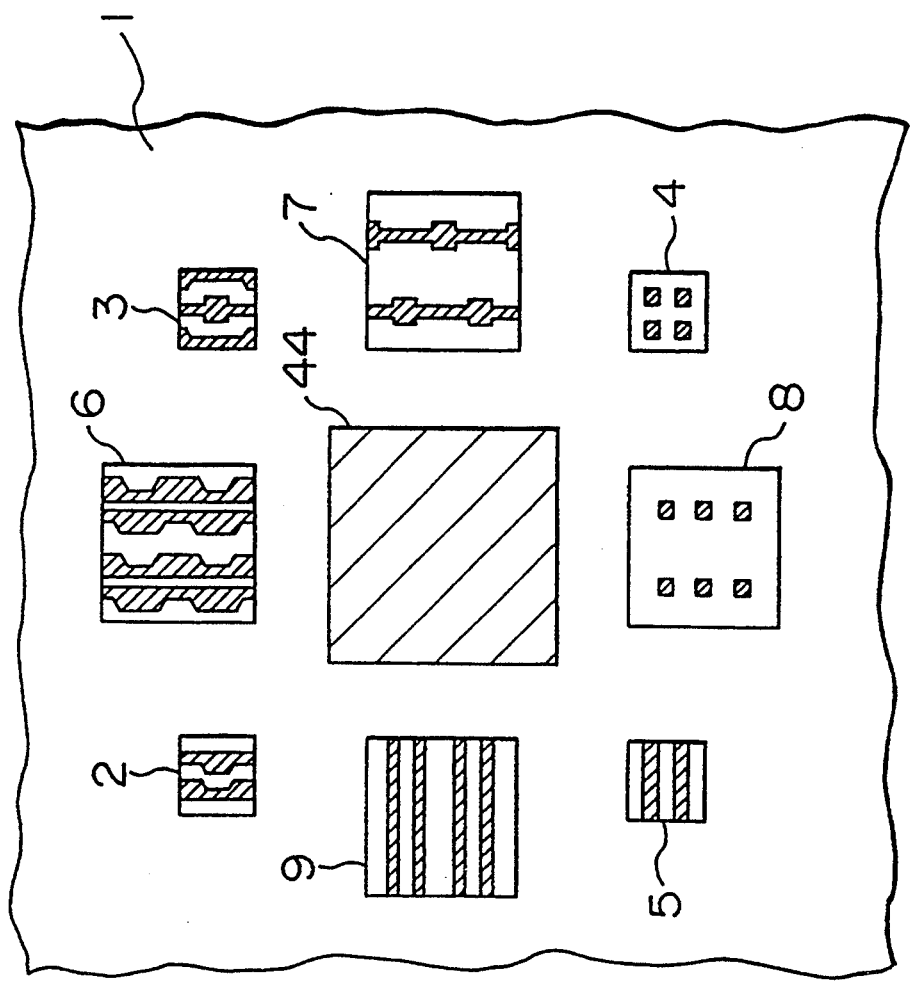
FIG. 1(b) is a plan view showing a typical example of an aperture for 64 Mb DRAM.
Figure 5:
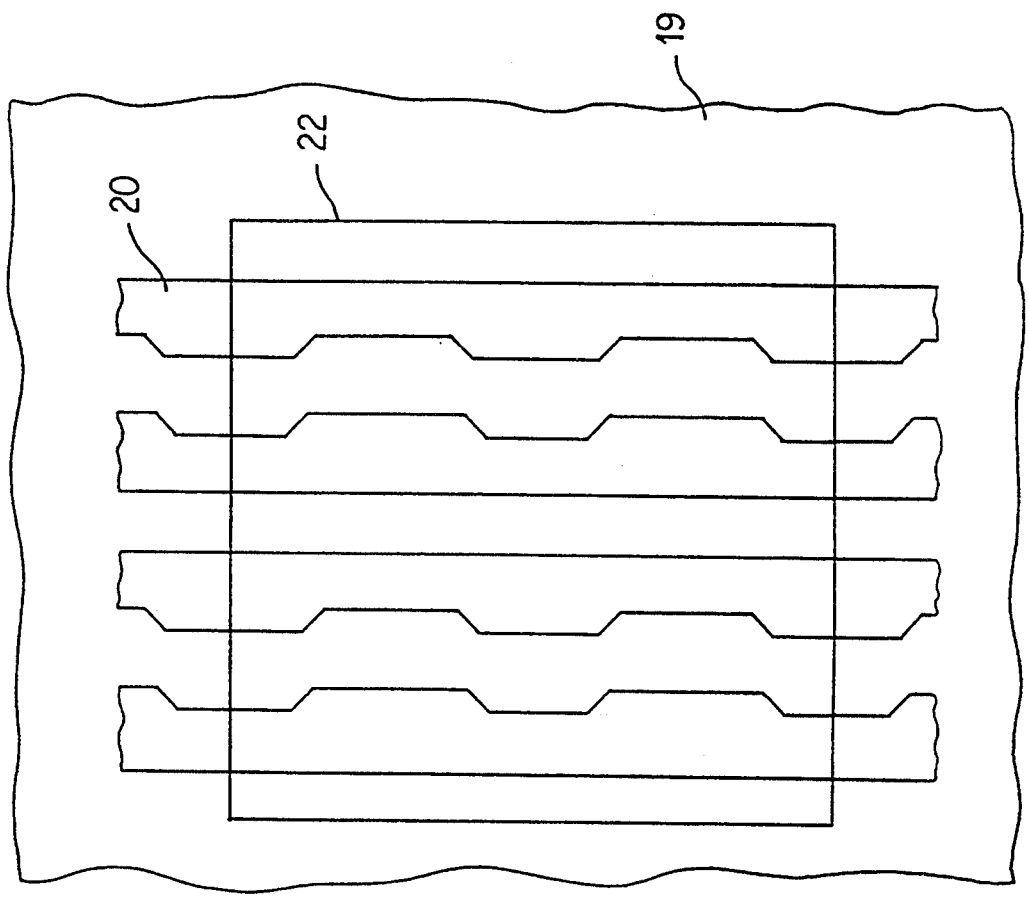
Figure 9:
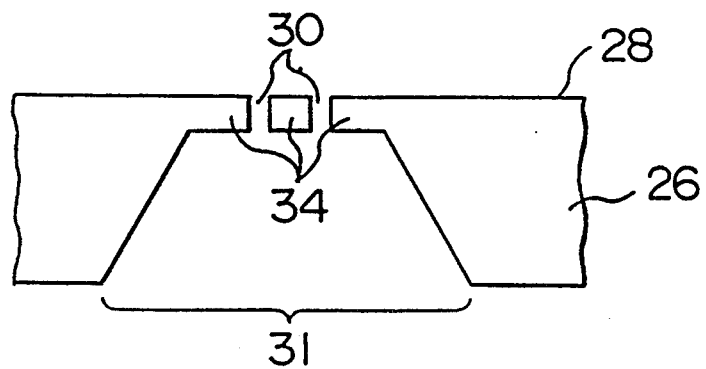
FIGS. 9, 10 and 11 are diagrams showing sectional views of a single crystalline silicon aperture according to the invention, FIGS. 12(a)-(g), 13(a)-(f), 14(a)-(e), and 15(a)-(e) diagrams showing methods of preparing the single crystalline silicon aperture, FIGS. 16(a), (b) and 17(a), (b) are diagrams showing the relation between shot density and throughput obtained when the 64 Mb DRAM pattern is exposed.
Figure 10:
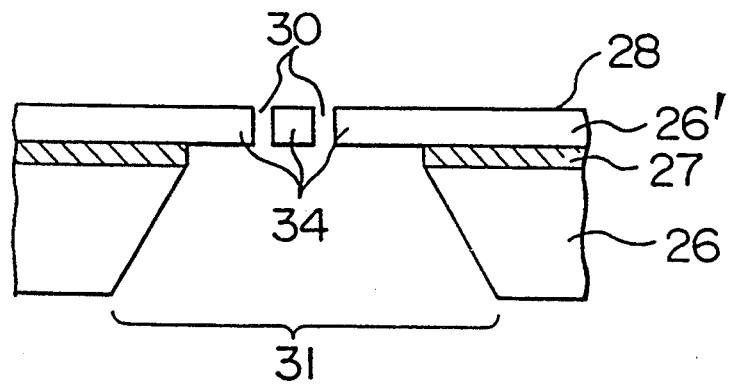
Figure 11:
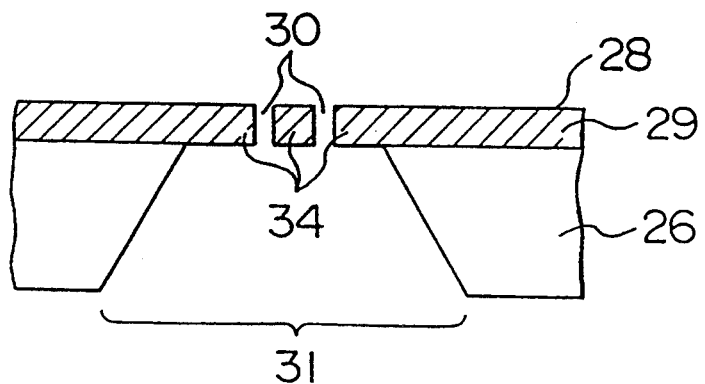

A pattern shown in FIG. 2 is a pattern for a gate layer of a switching MOS transistor constituting a memory cell of a 64 Mb DRAM. Here, on the assumption that the region 21 is of 2 $\mu$m×2 $\mu$m, pattern elements corresponding to 2 bits can be built in. Since the reduction power of the electron beam graphic apparatus shown in FIG. 1 is 1/25, the pattern form of 2 bits and its array themselves are magnified by 25 times and built in the aperture 1. Here, since the minimum dimension on the aperture is 7.5 $\mu$m and the work is for complicated form inclusive of inclined lines, the work is done by using silicon single crystal having excellent fine-workability as the aperture material. Structure diagrams of the aperture are shown in FIGS. 1 and 9. FIG. 1(b) is a plan view of the aperture and FIG. 9 is a sectional view of the aperture. Character 2 in FIG. 1(b) designates an opening portion for gate layer which corresponds to the region 21 in FIG. 2. An opening portion for exposure of a 4 $\mu$m×4 $\mu$m range of the same gate layer is designated by character 6. Character 3 designates a wiring layer, character 7 an opening portion for exposure of a 4 $\mu$m×4 $\mu$m range of the same wiring layer, character 4 an opening portion for wiring connection hole (contact hole), character 8 an opening portion for contact hole in different array, and characters 5 and 9 designate opening portions for aluminum wiring layer with 5 corresponding to 2 $\mu$m×2 $\mu$m and 9 corresponding to 4 $\mu$m×4 $\mu$m.

Character 44 designates a rectangular opening portion similar to conventional one which is used for a large area portion. In FIG. 1(b), hatching portions indicate opening portions.

It is to be noted that the square line surrounding each opening portion indicates the region (2 $\mu$m×2 $\mu$m or 4 $\mu$m×4 $\mu$m) corresponding to an object to be exposed.

Figure 12A:
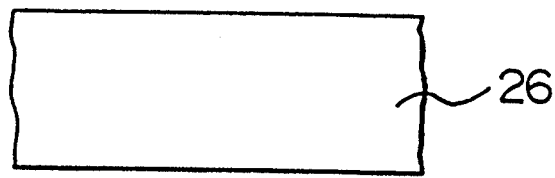
Figure 12B:
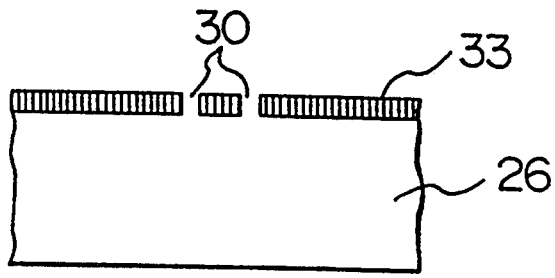
Figure 12C:
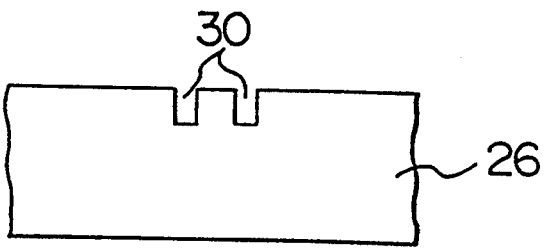
Figure 12D:
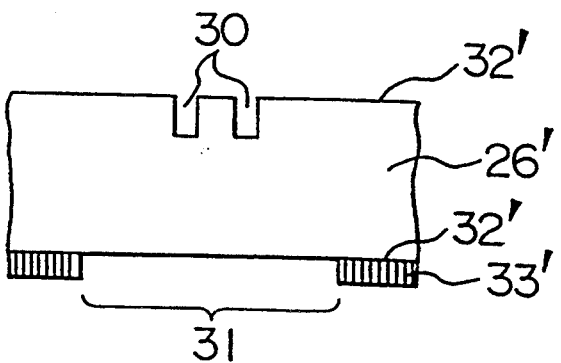
Figure 12E:
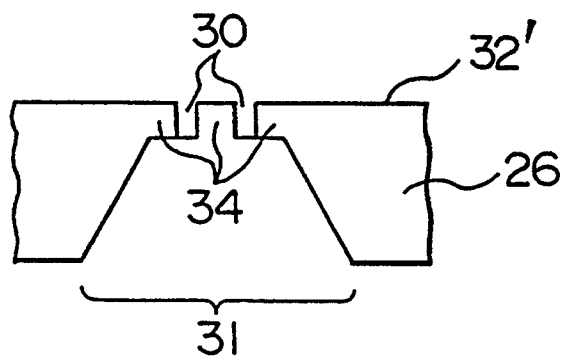
Figure 12F:
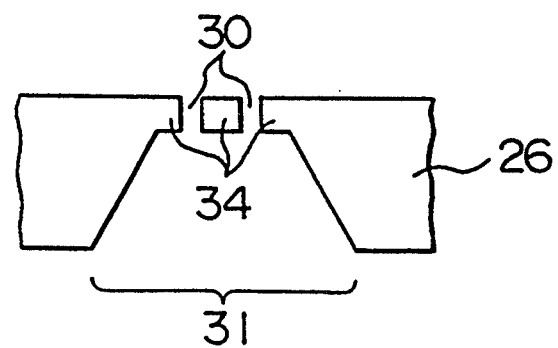
Figure 12G:
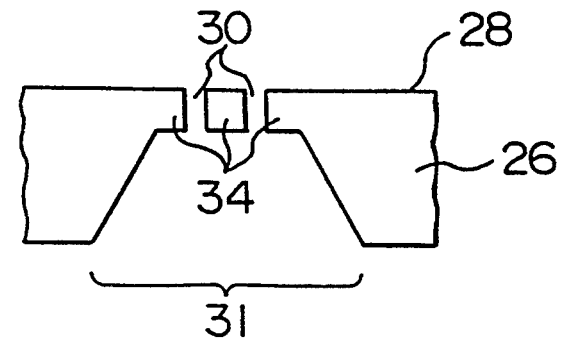
Figure 13A:
Figure 13B:
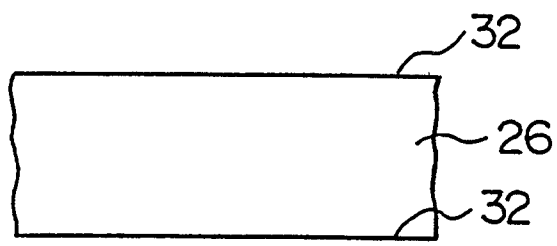
Figure 13C:
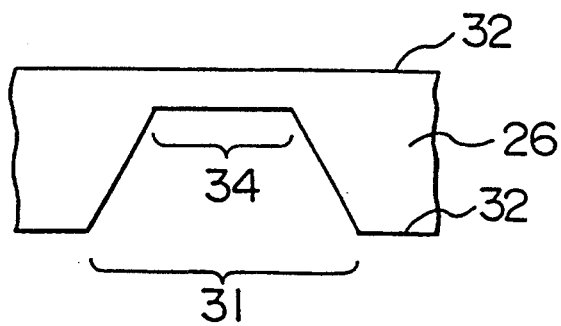
Figure 13D:
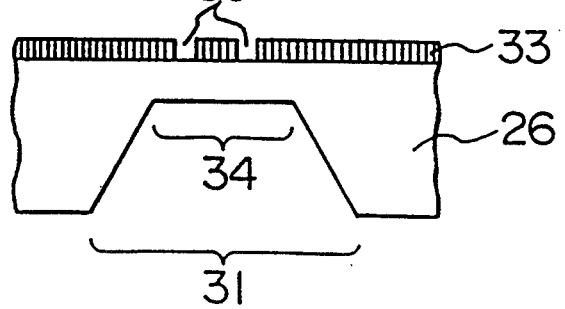
Figure 13E:
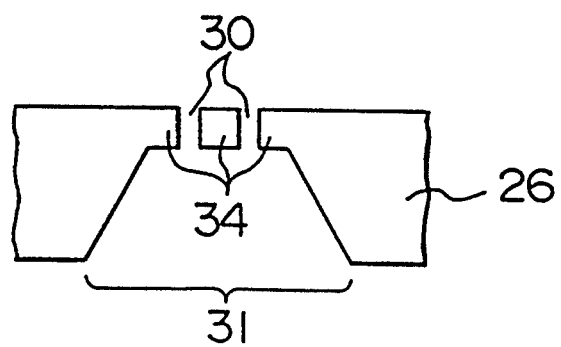
Figure 13F:
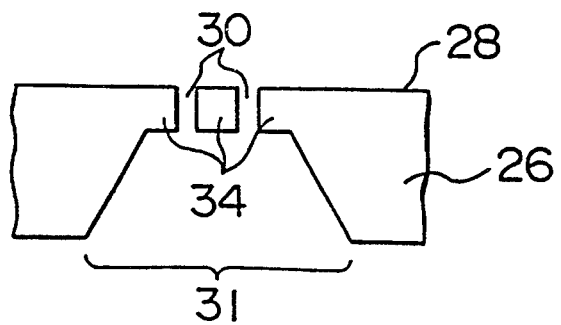
Figure 14A:
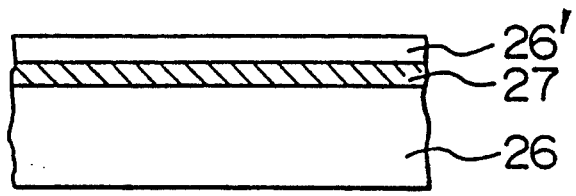
Figure 14B:
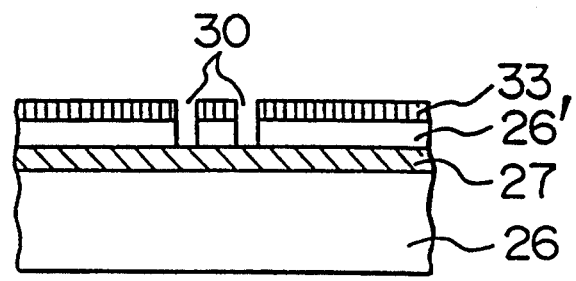
Figure 14C:
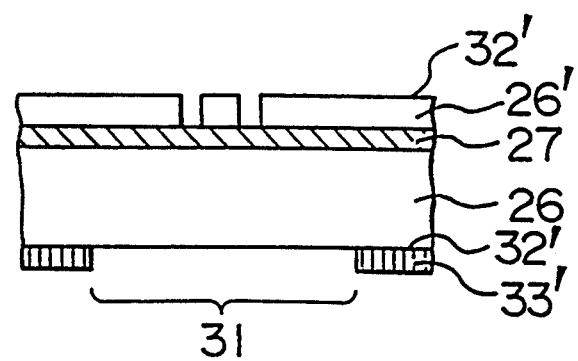
Figure 14D:
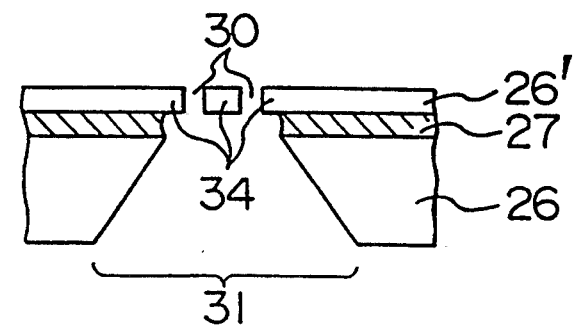
Figure 14E:
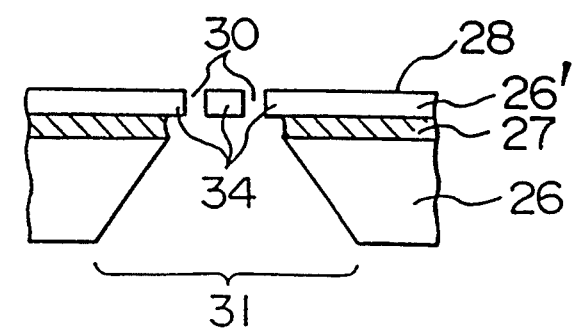
Figure 15A:
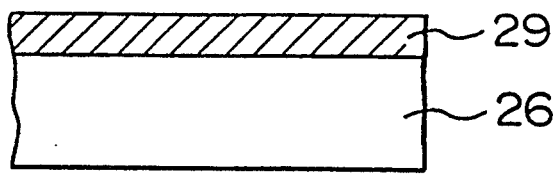
Figure 15B:
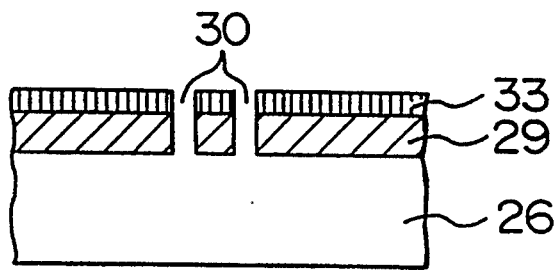
Figure 15C:
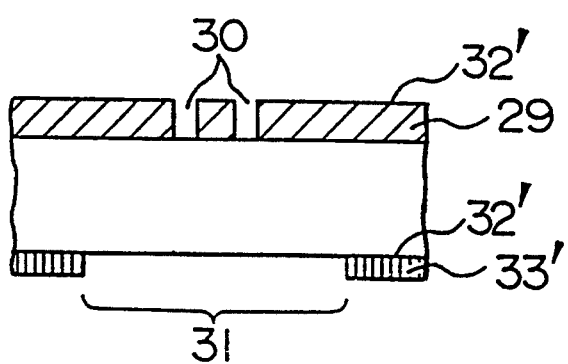
Figure 15D:
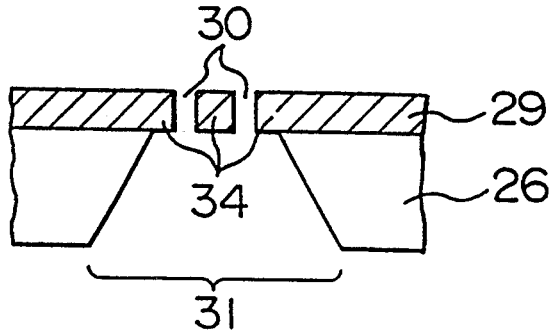
Figure 15E:
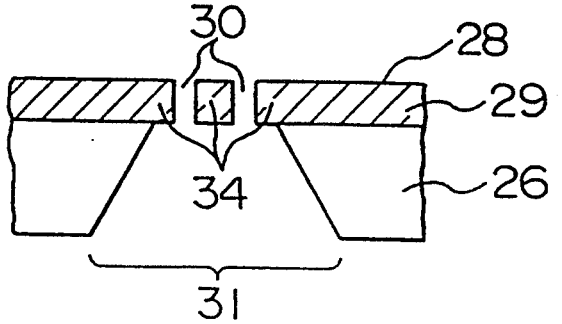

The opening portion 2, 3, 4 and 5 in FIG. 1(b) represent the minimum repetition unit which is so named in the present invention. These opening portions represent the unit, exposure of which can merely be repeated to ensure exposure of a complete pattern. Gathering from the results shown in FIG. 8, the thickness of the silicon thin film portion may be 20 $\mu$m in the case of the electron beam source 1 of 50 KV accelerating voltage used this time. The pattern could be worked by dry etching with a dimensional accuracy of 0.5 $\mu$m or less. A method of preparing this aperture will be described. Firstly, resist 30 is coated on a rotating (100) silicon substrate 26 shown in FIG. 12(a) and thereafter a desired pattern 30 is exposed and developed by the conventional variable shaping exposure method (FIG. 12(b)). Subsequently, etching is effected to a depth of 20 $\mu$m by silicon dry etching using this resist pattern 33 as a mask (FIG. 12(c)). Thereafter, as shown in FIG. 12(d), a resist pattern 31 is formed on the back of the (100) silicon substrate 26 and then the resist pattern is etched with kalium hydroxide aqueous solution or pyrocatechol to form a silicon thin film 34 of 20 $\mu$m as shown in FIG. 12(f). Finally, gold 28 is vapor deposited to 0.3 $\mu$m to provide a surface protective film, ending in completion. Alternatively, as shown in FIG. 13, the work sequence is inverted so that a silicon thin film portion 34 may first be formed by wet etching and then a pattern may be formed by dry etching, thus preparing an aperture with exactly the same accuracy. When used as the silicon substrate was a pasted silicon substrate including a silicon dioxide film 27 at a depth of 20 $\mu$m from the surface or a silicon substrate having a high-concentration layer 29 formed by implanting ions of boron or the like to a depth of 20 $\mu$m from the surface, an aperture could be prepared with the film thickness of the thin film portions 26' and 29 controlled satisfactorily. The preparation process shown in FIG. 2 or 13 is used in common for any of the substrates. FIG. 14 shows the preparation process for the pasted substrate and FIG. 15 shows the aperture preparation process for the ion implanted substrate. In any case, upon the back etching with kalium hydroxide aqueous solution or the like in (d), the etching stops at the silicon dioxide film 27 or the ion implanted film 29 and therefore the film thickness of the silicon thin film portion 26' and 29 can be controlled easily. When using the pasted substrate, the oxide film 27 is finally removed with fluoric acid as shown in FIG. 14(e). in any case, the back etching may precede the surface pattern formation as in FIG. 13 to obtain the same results.

Figure 4:
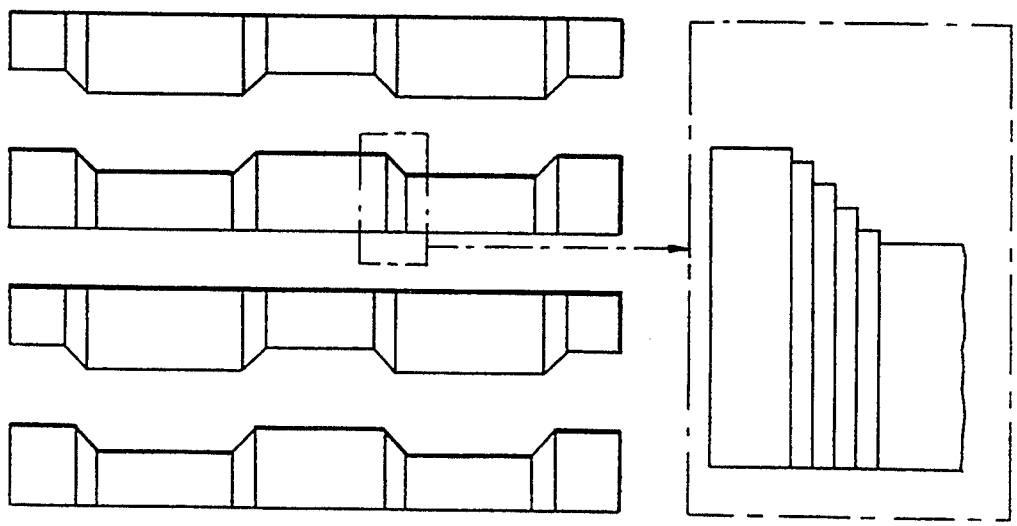
FIG. 4 is a diagram for explaining pattern division according to the conventional variable shaping scheme.

In the surface pattern formation, in addition to the pattern for the gate layer, patterns for layers to be exposed similarly and the rectangular pattern 44 for variable shaping used conventionally were built in the same aperture 1. The gate pattern 2, one of patterns of the aperture 1, was selected by means of the deflector 13 and exposure onto the wafer 19 was carried out. A pattern obtained through one shot according to the present method is equivalent to a pattern obtained through 20 shots according to the conventional variable shaping scheme shown in FIG. 4. Accordingly, the shot number for the memory array portion could be reduced to 1/20 of the conventional shot number.

Embodiment 2

Figure 6:
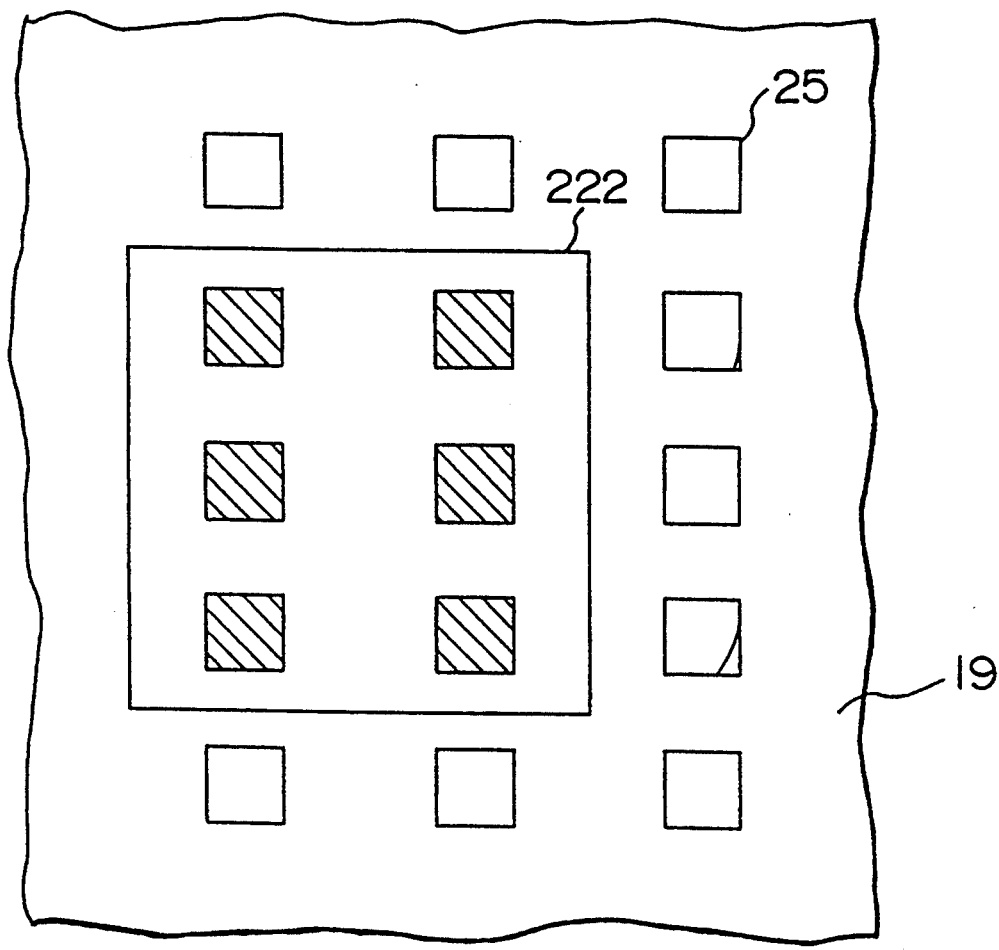
FIG. 6 is a diagram showing a contact layer pattern of 64 Mb DRAM pattern.
Figure 7:
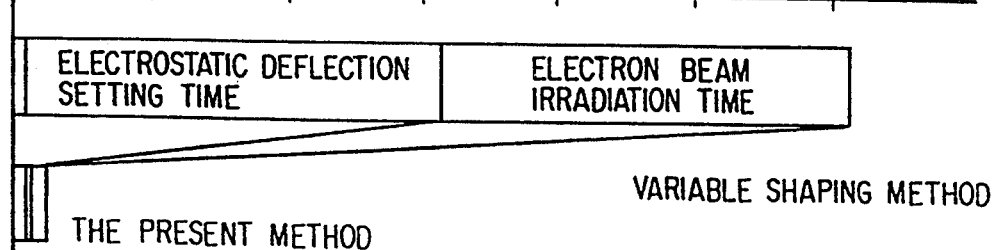
FIG. 7 is a diagram showing exposure time per wafer of the gate layer of 64 Mb DRAM pattern.

Similarly, an embodiment in which a 4×4 μm region of 64 Mb DRAM pattern is exposed collectively will be described with reference to FIGS. 1, 5, 6, 7, 16 and 17. In any case, the same apparatus as that used in embodiment 1 is employed. In this case, an element pattern of 12 bits is contained in 4×4 μm regions 22 and 222. The most complicated pattern is for the gate layer described in embodiment 1. If this is exposed by the conventional variable shaping method, 120 shots are required. In the 64 Mb DRAM, 64 M bits are exposed even in only the memory pattern and since 10 shots per bit are required in the conventional variable shaping, the total shot number amounts to $6.4 \times 10^8$ shots. Contrary to this, in the present invention, reduction to $5.3 \times 10^6$ shots can be ensured. As in embodiment 1, pattern forms and their arrays themselves contained in the 4×4 μm region of 64 Mb DRAM are magnified by 25 times and patterns for all layers and a rectangular pattern were built in a silicon single crystalline aperture 1. A gate layer pattern 6 was selected by means of the deflector 13 and exposed. As shown in FIG. 7, the exposure time consumed for exposure of 100 chips per wafer amounted to 3 hours or more with the conventional variable shaping method but in exposure according to the invention, all the chips could be exposed within 1.5 minutes.

Subsequently, a contact layer different from the gate layer was exposed onto the second wafer. A pattern 25 (8 in FIG. 1) for contact layer has already been built in the aperture 1 and the pattern 8 is therefore selected by means of the deflector 13 without changing the aperture. This pattern is an example of the simplest pattern. In this pattern, one pattern can be exposed by one shot in the case of the conventional variable shaping. Since $3.2 \times 10^7$ patterns of this type are present per chip, the total shot number per chip for only the memory array portion amounts to $3.2 \times 10^7$ shots with the conventional exposure method. Exposure according to the present invention will now be described. In FIG. 6, the 4×4 μm region 222 contains patterns corresponding to 6 shots in the conventional technique and therefore the total number per chip for only the memory array portion is $5.3 \times 10^6$ shots equal to the total shot number upon exposure of the gate layer, according to the method of the invention. Actually, the exposure time consumed for exposure of 100 chips per wafer amounted to 7.5 minutes in the case of the conventional shaping scheme but in the exposure according to the invention, all chips could be exposed within 1.5 minutes. In this manner, according to the present invention, by making an aperture pattern (opening portion) dedicated to a pattern layer standing for an object, a high throughput can be realized independently of pattern density. When expressed by using resists sensitivity (S), current density (J), wait time (t) of electron optics, total shot number (N) and overhead time ($t_O$) such as for vacuum evacuation, the exposure time (T) per wafer is $T = (S/J + t) \times N + t_O$. Here, on the assumption that standard values of individual parameters are such that the resist sensitivity (S) is 1 μC/cm$^2$, the current density (J) of electron beam is 10 A/cm$^2$, the wait time (t) of electron optics is 100 ns and the overhead time ($t_O$) is 160s, the throughput upon exposure of only the memory portion is obtained as shown in FIGS. 16 and 17. Abscissa represents the exposure shot density and ordinate represents the throughput, thus indicating the results of examination as to how the throughput is affected when individual parameters vary. FIG. 16(a) is a diagram in which the resist sensitivity (S) is changed to take 0.5, 1, 2 and 5 μC/cm$^2$. FIG. 16(b) is a diagram in which the current density (J) is changed to take 20, 10 and 5 A/cm$^2$, FIG. 17(a) is a diagram in which the electrostatic wait time (t) changes to take 50, 100 and 200 ns, and FIG. 17(b) is a diagram in which the overhead time ($t_O$) is changed to take 80, 160 and 320 μC. The above results demonstrate that a factor affecting the throughput the most is the shot density, that is, the total shot number (N) per se. With the conventional variable shaping method, the shot density increases as complexity of pattern increases as in the case of the gate layer and the throughput is degraded considerably. Contrary to this, since according to the present invention the exposure shot density is constant regardless of the pattern contents, a throughput which is equally high for any layer pattern can be obtained. In practical memory exposure, since a peripheral circuit of poor periodicity is involved in addition to the repetition pattern, the rectangular pattern 44 built in the aperture is selected to permit the variable shaping method to be used in combination but the shot number for this is 10% or less of the total and hardly affects the throughput. As a result, exposure of any layers can be carried out at constant level and high speeds and therefore, in memory process procedure including 100 or more steps, process management removed of a delay due to complicated layers can be ensured and besides the constant throughput permits the process time to be predicted in advance, thereby permitting accurate setting of process schedule to advantage.

Figure 18:
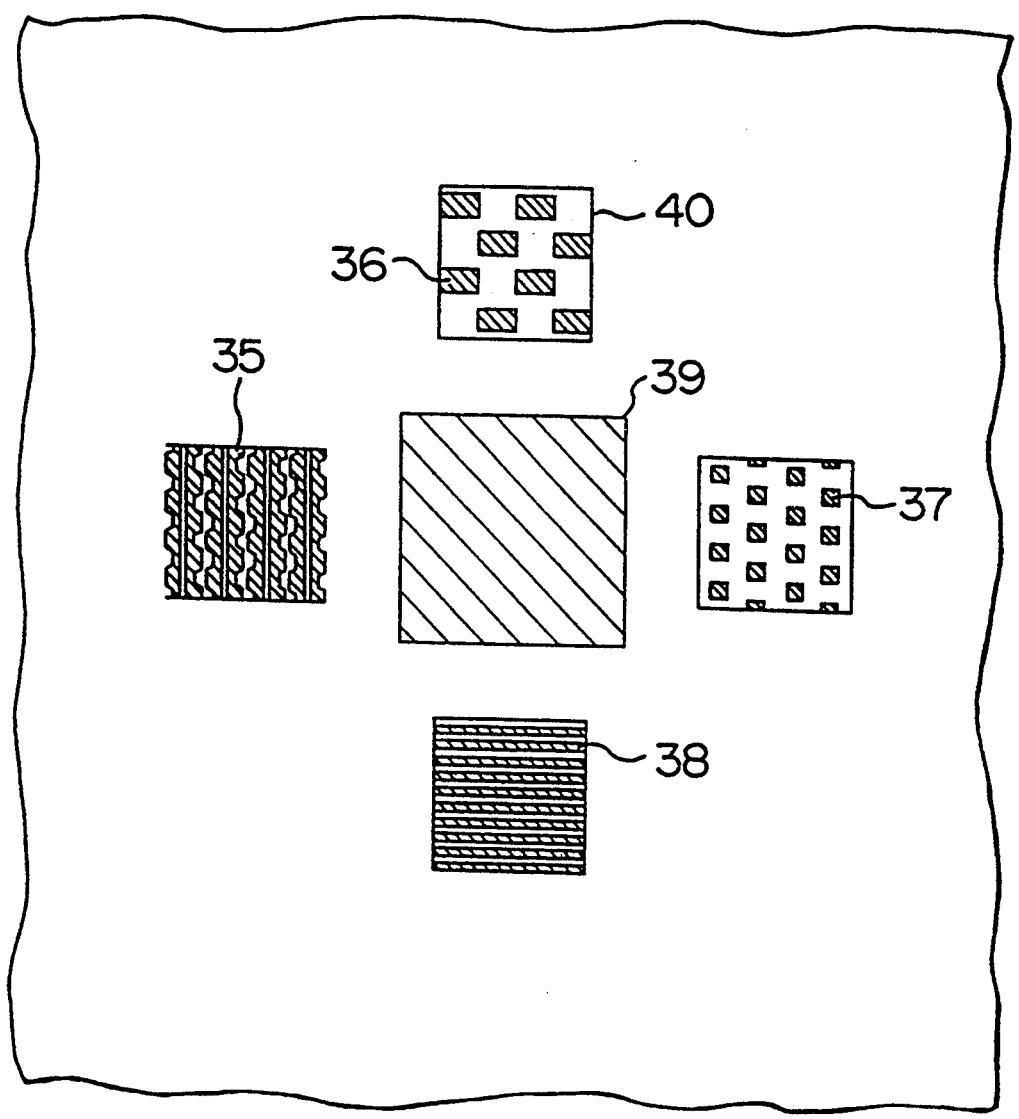
FIG. 18 is a plan view showing a typical example of an aperture for 256 Mb DRAM.

Further, even when the present method is applied to the case of advanced integration degree as in a 256 Mb DRAM, it suffices that the pattern built in the aperture is made to be finer and the number of patterns capable of being built in is increased as exemplified by a gate layer patterns 35 of FIG. 18, and the actual exposure shot density remains unchanged as shown in FIGS. 16 and 17.

In FIG. 18, character 35 designates an aperture for gate layer of 256 Mb DRAM, character 36 designates an aperture for through-hole layer of 256 Mb DRAM, character 37 designates an aperture for contact layer of 256 Mb DRAM, character 38 designates an aperture for aluminum layer of 256 Mb DRAM, character 39 designates a rectangular aperture for variable shaping, and character 40 designates a corresponding 4 μm×4 μm region on a wafer. Accordingly, the throughput obtained in exposure of 256 Mb DRAM was substantially as high as that obtained with the 64 Mb DRAM. It is to be noted that when the gate layer pattern 9 of FIG. 18 is exposed by the conventional variable shaping method, 320 shots are needed.

In the present invention, the throughput does not change with the pattern density (namely, complexity of pattern) and therefore the high throughput can be maintained for any complicated patterns. For this reason, in applications to exposure of highly-integrated devices, not only the performance of any layers can advantageously be maintained but also the high throughput can be maintained for the integration degree of any generation to advantage.

Needless to say, any effects thanks to the above feature can be enhanced as the area which can be exposed by one exposure operation increases.

While in the present embodiment the electron beam exposure has been described, quite the same effects can be obtained in exposure using an ion beam.

INDUSTRIAL APPLICABILITY

The present invention is useful for production methods of semiconductor devices, especially, for production methods of dynamic random access memory, static random access memory, various logics and microcomputer. Greatness of the industrial applicability resides in that the throughput which has been the fatal defect of the electron beam exposure method can be improved to make the electron beam exposure method usable to practical production.

We claim:

1. A pattern forming mask for charged or electron beam comprising:
   a plate;
   a plurality of first openings formed through said plate and forming a first pattern which includes a single minimum repetition pattern;
   a plurality of second openings formed through different areas of said plate than said first openings and forming a second pattern which includes at least two of said single minimum repetition pattern; and
   at least one third opening formed through different areas of said plate than said first and second openings and forming a rectangular pattern.

2. A pattern forming mask according to claim 1, wherein said plate is formed of a material mainly containing silicon.

3. A pattern forming mask according to claim 2, wherein said first openings form a plurality of first repetition patterns of different kinds and said second openings form a plurality of second repetition patterns of different kinds corresponding to said first repetition patterns.

4. A charged beam exposure method using a charged beam to expose repetition patterns to a semiconductor chip comprising the steps of:
   exposing said chip to a first pattern which includes a single minimum repetition pattern; and
   exposing said chip to a second pattern which includes a plurality of said minimum repetition pattern.

5. A charged beam exposure method according to claim 4, wherein the number of exposure is $3 \times 10^5$ to $1 \times 10^4/mm^2$ for all layers constituting patterns.

6. A pattern exposure apparatus comprising:
   a) a charged beam generating means;
   b) a mask means for forming patterns, said mask means comprising:
      a plate means;
      a plurality of first openings formed through said plate means and forming a first pattern which includes a single minimum repetition pattern;
      a plurality of second openings formed through different areas of said plate means than said first openings and forming a second pattern which includes at least two of said single minimum repetition pattern; and
      at least one third opening formed through different areas of said plate means than said first and second openings and forming a rectangular pattern; and
   c) means for controlling said charged beam.

7. A pattern exposure apparatus according to claim 6, wherein said mask means controls the plane projection shape of said charged beam and has a thin film region having an opening portion for control of the plane projection shape of said charged beam and a thick film region which supports said thin film region and is thicker than said thin film region, and that a main material forming said thin film region and a main material forming said thick film region are the same material.

8. A pattern exposure apparatus according to claim 7, wherein said thin film region and thick film region are of a silicon single crystal.

9. A pattern exposure apparatus according to claim 7, wherein the thickness of said thin film region is 15 to 20 μm.

10. A pattern exposure apparatus comprising:
    a) a charged beam generating means;
    b) a mask means for forming patterns, said mask means in correspondence to each of at least two or more pattern layers having repetition patterns comprising:
       a plate means;
       a plurality of first openings formed through said plate means and forming a first pattern which includes a single minimum repetition pattern;
       a plurality of second openings formed through different areas of said plate means than said first openings and forming a second pattern which includes at least two of said single minimum repetition pattern; and
       at least one third opening formed through different areas of said plate means than said first and second openings and forming a rectangular pattern; and
    c) means for controlling said charged beam.

11. A pattern exposure apparatus according to claim 10, wherein said mask means controls the plane projection shape of said charged beam and has a thin film region having an opening portion for control of a plane projection shape of said charged beam and a thick film region which supports said thin film region and is thicker than said thin film region, and that a main material forming said thin film region and a main material forming said thick film region are the same material.

12. A pattern exposure apparatus according to claim 11, wherein said thin film region and thick film region are of a silicon single crystal.

* * * * *